United States Patent [19]

Eden et al.

[11] Patent Number: 5,278,105
[45] Date of Patent: Jan. 11, 1994

[54] SEMICONDUCTOR DEVICE WITH DUMMY FEATURES IN ACTIVE LAYERS

[75] Inventors: Shmuel Eden; Yosi Amir, both of Haifa, Israel

[73] Assignee: Intel Corporation, Santa Clara, Calif.

[21] Appl. No.: 932,347

[22] Filed: Aug. 19, 1992

[51] Int. Cl.⁵ .......................................... H01L 21/00
[52] U.S. Cl. .................................. 437/250; 257/922; 364/488; 364/491
[58] Field of Search ...................... 257/210, 7, 8, 9, 10, 257/11, 577, 658, 926, 205; 437/228, 41, 250; 364/488, 491

[56] References Cited

U.S. PATENT DOCUMENTS

| | | | |
|---|---|---|---|
| 4,711,701 | 12/1987 | Melevige | 437/41 |
| 4,916,514 | 4/1990 | Nowak | 257/758 |
| 4,949,162 | 8/1990 | Tamaki et al. | 257/499 |
| 4,963,501 | 10/1990 | Ryan | 437/40 |
| 4,973,562 | 11/1990 | Den Blanken | 437/189 |
| 5,032,890 | 7/1991 | Ushiku et al. | 257/700 |
| 5,132,237 | 7/1992 | Matthews | 437/40 |

Primary Examiner—Olik Chaudhuri
Assistant Examiner—H. Jey Tsai
Attorney, Agent, or Firm—Blakely, Sokoloff, Taylor & Zafman

[57] ABSTRACT

A design and method for fabricating devices with reduced loading effect is described. The disclosed design creates dummy features to increase the percentage of material remaining after etch of an active layer. This improves device reliability by preventing resist punch through during etch. Also, yields are improved as no devices are sacrificed to increase the percentage material remaining. Since dummy features are placed on all devices fabricated in a single production process, the percentage material remaining after etch is the same for all devices for a given layer. This allows the same recipe to be used for all devices fabricated by the process, thereby increasing throughput.

29 Claims, 5 Drawing Sheets

SEMICONDUCTOR DEVICE WITH DUMMY FEATURES IN ACTIVE LAYERS

BACKGROUND OF THE INVENTION

1. Field Of The Invention

The present invention relates to the field of semiconductor devices and more particularly to a method of design and manufacture of a device having dummy features in the active layers.

2. Prior Art

During the manufacture of semiconductor devices, numerous device structures or insulative layers are fabricated from various materials deposited on the surface of a semiconductor surface. Typically, a layer of the material from which a given structure is formed is deposited by sputter deposition, chemical vapor deposition (CVD), or other means. The layer is coated with photoresist which is patterned to form a mask. The material is then removed from exposed regions by a wet or dry etch as is well known in the art. The material may be, for example, a metal layer such as aluminum, titanium, tungsten, titanium nitride, various noble, near-noble or precious metals, as well as any combination of the foregoing or other metals; a silicide, including tungsten silicide, titanium silicide, and cobalt silicide among others; a polysilicon layer, doped or undoped; an oxide layer, doped or undoped; or a polymer layer such as polyimide, parylene, or a fluoropolymer, for example. The structure or layers formed could be, for example, various types of interconnection lines, contact or via fills, gates, word or bit lines, spacers, or insulative layers, among others. In addition to structures formed on the semiconductor substrate, various active regions, such as diffusion regions, are formed within the substrate.

As described above, after deposition of, for example, a metal layer, an etch of the layer is performed. Often, the etch is performed after a masking layer has been formed to define the desired pattern. In some cases, however, such as during a contact or via opening etchback, no masking layer is used and a blanket etchback is performed. In either case, the etch time depends on the amount of metal which is to remain on the substrate after the etch. That is, if the desired features occupy a small fraction of the surface area of the substrate, a longer etch time will be required than if the features occupy a larger percentage of the surface area. This phenomenon is known as the loading effect and is well known in the art.

The loading effect can cause various manufacturing problems. If a given layer has a small percentage of the layer remaining after the etch (i.e. most of the layer is to be etched), the required etch time is longer. The longer etch time can lead to resist punch through. This is due to the fact that, although the etch used is generally selective so that the layer etches at a faster rate than the resist, the resist does etch at some finite rate. This causes portions of the photoresist used as a mask to be etched through, which causes a portion of the feature, for example, a metal line, to be etched. The etching of the feature can cause device failure thereby reducing yields. Additionally, devices having partially etched metal lines pose a reliability hazard, as they may fail during use. In the prior art, the resist punch through problem is often overcome by leaving several individual die on a wafer completely covered with a metal layer, to increase the percentage of the wafer with metal remaining. Of course, this renders the covered die non-functional, thereby reducing the wafer yield.

The above described loading effect also affects the deposition times of subsequent layers. This can occur due to the fact that the impedance encountered during deposition is dependent upon the amount of metal remaining on the wafers. For example, a passivation layer deposited on a metal layer will have a longer deposition time when a small percentage of the metal remains, and a shorter deposition time when a large percentage of the preceding metal layer remains. The longer etch and deposition time caused by the loading effect can adversely affect throughput times of the individual processes. Additionally, the loading effect can also cause local variations in etch and deposition rates across the surface of a wafer, leading to non-uniformities.

The loading effect also adversely affects product manufacturability in fabrication facilities where several different types of devices are fabricated by a single process. For example, a particular process sequence may be used for metal 1 etch for all devices. During production, a lot of wafers of one type of device may be processed through that sequence, followed by a lot of wafers of a different device type. If the two different products have different percentage metal remaining, different etch parameters must be utilized to process the different lots. The parameters used may include gas flow rates, power, pressure, electrode gap distance, and etch time. The set of parameters used for an etch or deposition is referred to as a recipe. The requirement of different parameters means that each new product must have the etch process re-engineered so that it is optimized for that product. In addition to the additional engineering resources utilized, the requirement for different recipes for the various etch and deposition steps for each product reduces throughput as the etch or deposition recipe must be changed prior to the processing of a lot of wafers through the process.

What is needed is a method and design allowing for different types of devices to be processed through a process step utilizing the same process recipe.

SUMMARY OF THE INVENTION

A design and manufacture of a semiconductor device is disclosed. In a preferred embodiment, the layout of an active layer is extracted from the device's database. All active areas of the active layer are recorded in a virtual layer. Any process dependent special design rules are taken into account by adding a guard band of a specified width around the appropriate active regions. Next, a further guard band is drawn around all active regions of all layers to avoid line to line and interlayer parastic capacitance. This procedure is repeated with all active layers, adding active regions and any guard bands to the virtual layer for each layer. A blocking layer is added to the virtual layer to block out user defined regions where dummy features cannot be added. The virtual layer (including blocking layer) defines the regions where dummy features cannot be added. Dummy features are then added outside of these regions for each active layer. The addition of the dummy features causes the percentage of, for example, metal remaining, to be approximately the same regardless of device type, allowing for the same process recipe to be used at each process step regardless of the device being fabricated.

BRIEF DESCRIPTION OF THE DRAWINGS

The present invention is illustrated by way of example and not limitation in the following figures in which.

DETAILED DESCRIPTION OF THE PREFERRED EMBODIMENT

In the following description, numerous specific details are set forth such as specific patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, although a specific sequence of steps is described, it will be readily appreciated that one or more steps may be combined or performed in an order other than that specified herein.

As described fully below, dummy features are added to active layers in order to equalize the amount of material remaining after the etch of an active layer from one type of device to the next. Before creating the dummy features, a virtual layer, which is a two dimensional composite of the features from all active layers (plus various guard bands as described below) is created to define the regions where no dummy features may be present. The virtual layer is created by performing an OR operation with all active layers, so that the virtual layer delineates regions which are occupied by features (plus applicable guard bands) in one or more active layers of the device. It will be understood that in the following figures, the virtual layer is shown as having distinct features all active layers only for purposes of illustration.

Figure 1:
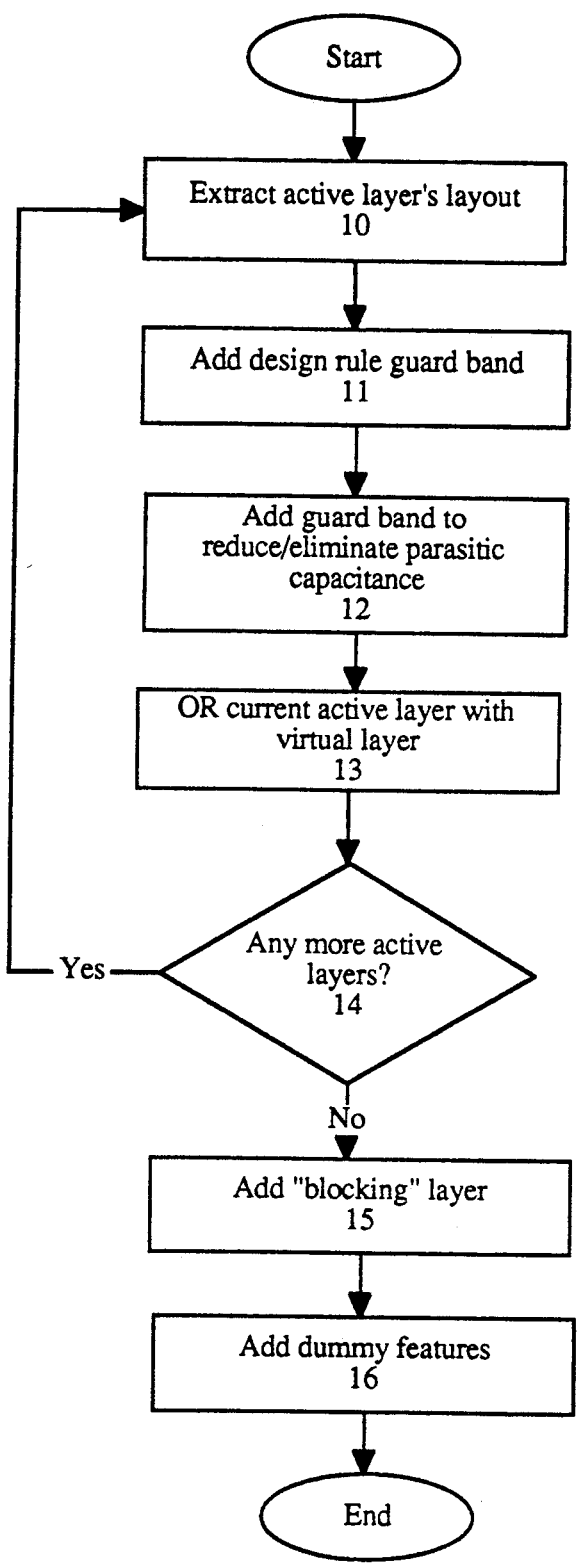
FIG. 1 shows a flow chart of the steps in a preferred embodiment of the present invention.

FIG. 1 shows a flow chart of the steps of a preferred embodiment of the present invention. First, an active layer's layout is extracted from the database as shown by step 10. The active layer could be, for example, a diffusion layer, a polysilicon layer, or a metal layer. For example, the first active layer extracted could be a diffusion layer. Next, all of the features of the active layer, for example, source and drain diffusions and any other diffusion regions in that active layer, are plotted in a virtual layer. Feature, as used herein, is not limited to active features which form part of a device, for example, but include any defined element of an active layer that may be present for design or manufacturing purposes. The virtual layer is simply a duplicate of the first active layer extracted at this point.

Next, as shown by step 11 of FIG. 1, a design rule guard band is added. The design rule guard band includes any special design rules which require, for example, that no metal layer be within a specified distance from other metal lines in the same layer. These special design rules are process dependent. For example, in a preferred manufacturing process, metal to metal spacing must exceed $2\mu$ to prevent metal shorts. As another example, diffusion to diffusion spacing must be sufficient to prevent punch-through. The special design rule guard bands are placed around the perimeter of each feature in each active layer, and have a width as defined by the user for that layer. At this point, the virtual layer includes the features of the first active layer, with appropriate design rule guard bands added to the appropriate features.

Referring again to FIG. 1, parasitic capacitance guard bands are added to each feature to reduce or eliminate parasitic capacitance as shown by step 12. Software programs exist which can calculate the lateral distance which must be kept from any active area or feature in order to add less than a specified percentage parasitic capacitance. The parasitic capacitance guard bands formed in a preferred process have a width of approximately $4\mu$. The exact maximum allowable parasitic capacitance will depend upon the performance required by the user. In order to keep any parasitic capacitance at or below the maximum required by the user, the parasitic capacitance guard band around each feature of each active layer is based upon the worst-case parasitic capacitance. For example, if a parasitic capacitance guard band of $4\mu$ is required to keep the metal 1-diffusion parasitic capacitance at or below the maximum, while a $2\mu$ guard band is required to keep the metal 1-metal 2 parasitic capacitance at or below the maximum, then a $4\mu$ parasitic capacitance guard band will be added to the metal 1 layer features at step 12 (assuming there are no other cross-capacitances requiring a parasitic capacitance guard band greater than $4\mu$).

Then, as shown by step 13 of FIG. 1, the current active layer is OR'ed with the virtual layer, to create an updated virtual layer which is a two dimensional composite of all active layers (plus design rule and parasitic capacitance guard bands) extracted so far. This step need not be performed for the first active layer extracted.

Referring to step 14 of FIG. 1, a determination is made as whether there are any more active layers to be OR'ed with the virtual layer. If not, processing proceeds to step 15. If so, then processing returns to step 10, where the next active layers's layout is extracted. Then, in step 11, user defined design rule guard bands are added to the next active layer's layout. Next, in step 12, parasitic capacitance guard bands are added to the next active layer's layout. Then, in step 13, this next active layer (including design rule and parasitic capacitance guard bands) is OR'ed with the virtual layer. This process is repeated until all active layers (plus guard bands) have been added to the virtual layer in a currently preferred embodiment.

Figure 2:
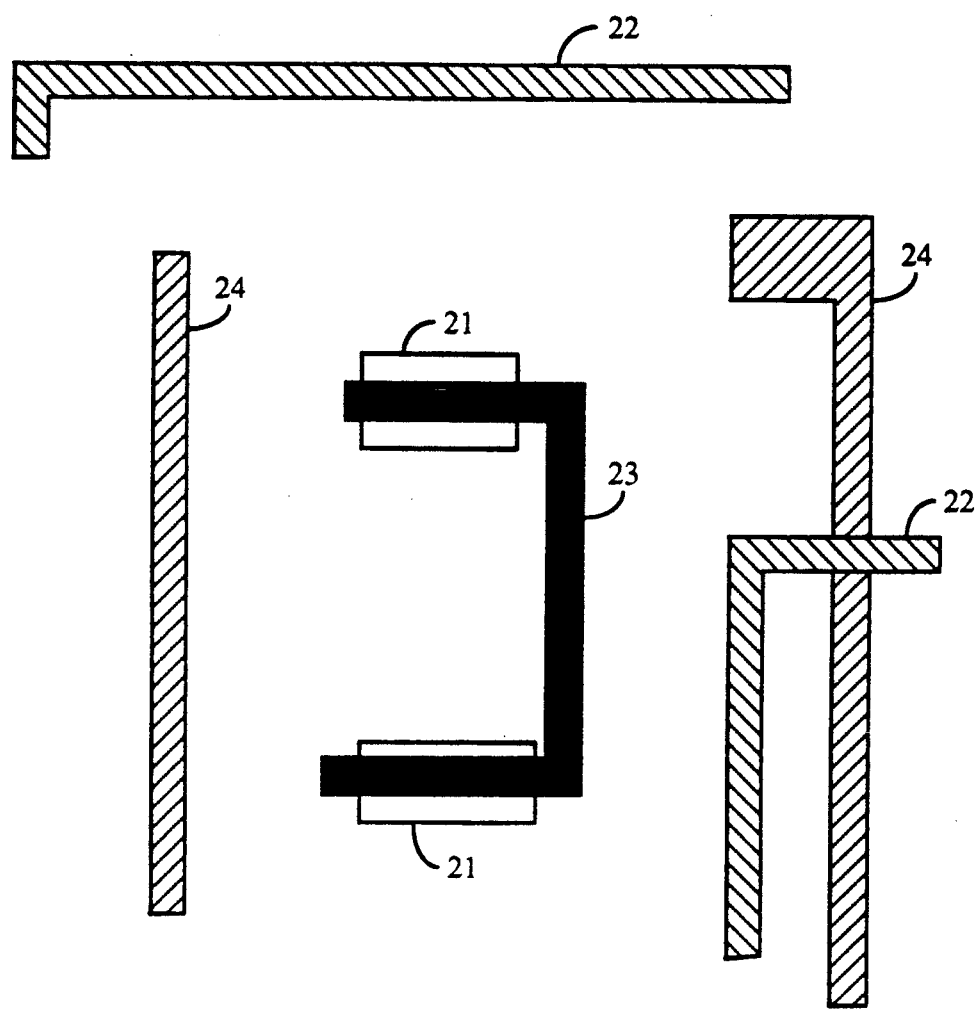
FIG. 2 represents the active layer features plus design rule guard bands in a virtual layer formed in accordance with a preferred embodiment.

FIG. 2 shows a portion of the virtual layer after all active layers have been processed through steps 10–13 of FIG. 1. In the portion of the virtual layer shown in FIG. 2, features from four different active layers and their respective design rule guard bands are present. For purposes of illustration, the capacitance guard band is not shown in FIG. 2. Other regions of virtual layer not shown in FIG. 2 may have features from additional active layers. The portion of the virtual layer shown in FIG. 2 comprises features (and their design rule guard bands) from diffusion 21, metal 1 layer 22, polysilicon layer 23, and metal 2 layer 24.

Figure 3:
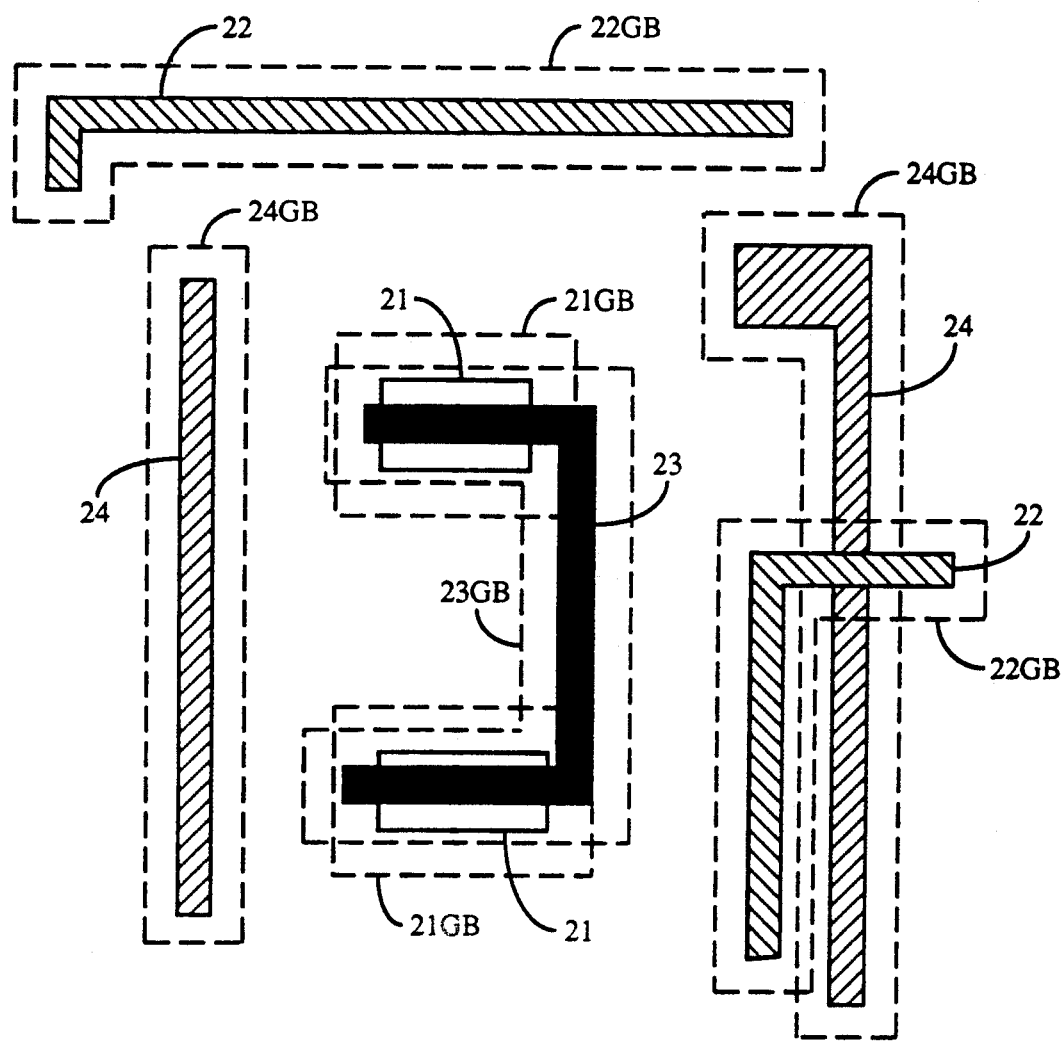
FIG. 3 represents the virtual layer of FIG. 2 with parasitic capacitance guard bands added.

FIG. 3 shows the portion of the virtual layer shown in FIG. 2 including the parasitic capacitance guard bands, shown as dashed lines, around each feature. The guard bands for each feature have been identified by using the reference numeral of that feature followed by a "GB." Thus, the guard band for diffusion regions 21 is identified as 21GB in FIG. 3, for example. As described earlier, the virtual layer is a single composite layer obtained by adding all active layer, special design rule guard bands, and parasitic capacitance guard bands together by using an OR operation. Thus, the virtual layer would not show any individual features or guard bands as has been done for illustration in FIGS. 2 and 3, but would consist of regions which have features or guard bands present in any one or more of the active layers.

Next, as shown by step 15 of FIG. 1, a blocking layer is added. The blocking layer is a layer of user defined regions where no dummy features can be added. This layer is OR'ed with the virtual layer and results in additional regions where no dummy features can be placed. The blocking layer is used to prevent or block dummy features from being placed in the regions, for example, where a corporate logo, copyright notice, alignment mark, or other such feature is present. Also, the blocking layer also blocks out sensitive areas where it is desired not to place any dummy features, such as where SRAMs, analog circuits, and sense amps, for example, are present.

Figure 4:
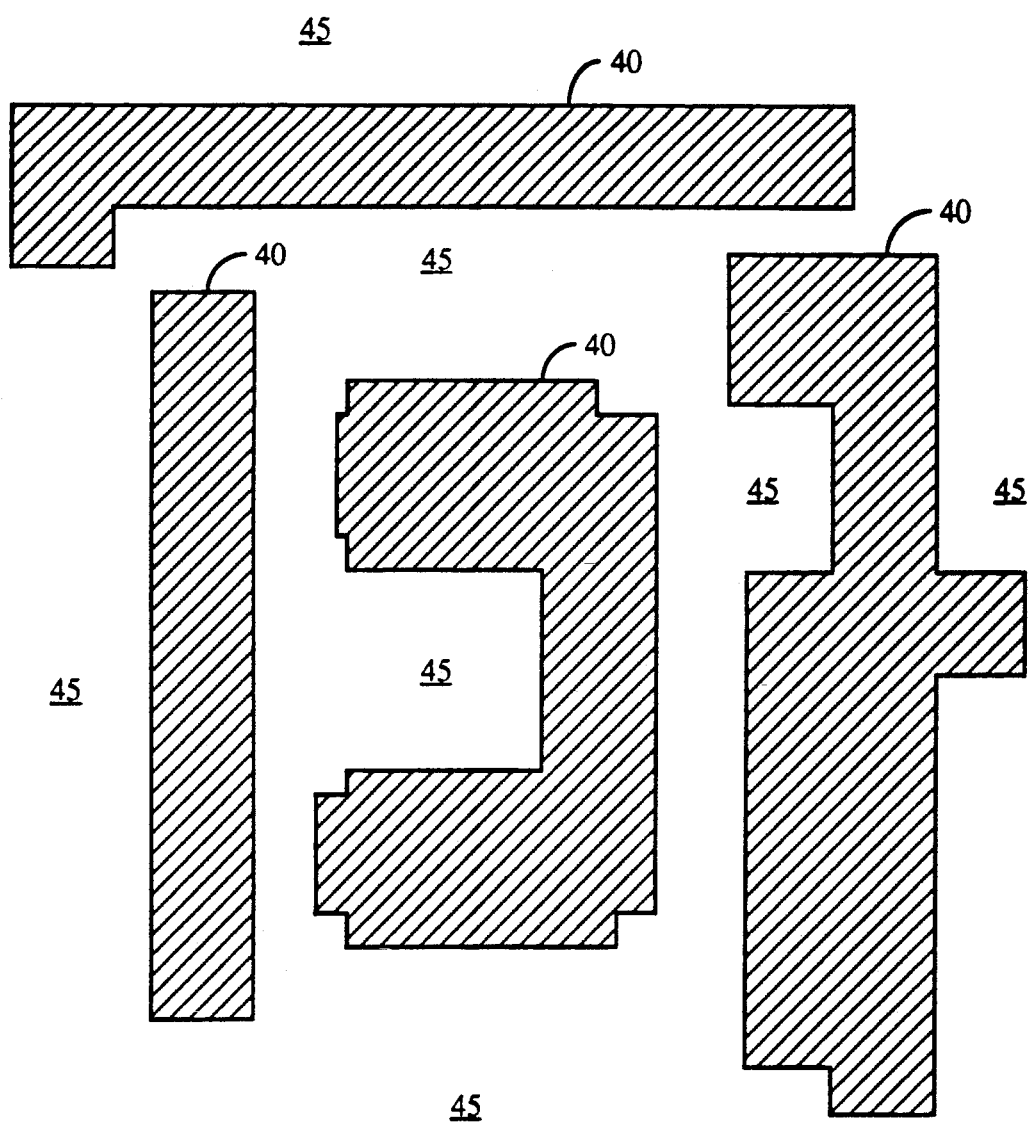
FIG. 4 represents use of the virtual layer to define the region where dummy features may be placed.

Referring to FIG. 4, the region of the virtual layer shown in FIG. 3, is shown. The boundaries of the hatched regions 40 correspond to the outer boundaries of the various guard bands shown in FIG. 3. The regions 40 are regions where no dummy features may be formed. In the portion of the virtual layer shown in FIGS. 2-4, none of the regions blocked by the blocking layer are present. At this point, the virtual layer comprises several regions 40 which are "blocked" regions. The blocked regions include all features, plus design rule and parasitic capacitance guard bands, of all active layers, plus regions defined in the blocking layer. In all other regions 45, dummy features are permitted.

Finally, as shown by Step 16 of FIG. 1, dummy features are added. In theory, the dummy features can be any size and shape. In fact, it may be possible to leave all of regions 45 covered with, for example, a metal layer. However, such an approach could cause problems which are difficult to predict since such features are not present on most devices and have not been studied extensively. Therefore, the routine used to generate dummy features follows the following general approach in a preferred embodiment of the present invention. First, no non-standard shapes or sizes are allowed. That only those shapes and sizes which are regularly used in device design are utilized. Generally, these shapes are some type of polygon. The size of the dummy features is similar to the size of other features found on the device. Next, the length is limited to no more than approximately $100\mu$ to prevent an antenna effect. That is, long metal lines could act as antennas during RF processing, thereby causing a high voltage to be built up on them. The maximum allowable length is defined by the technology design rules and is process dependent. Next, the features and spaces between the features must be within the process' resolution limit. Also, the dummy features should be placed as uniformly across the surface of the device as possible. Finally, dummy features should be added until the amount of material remaining after etch is approximately the same from device to device for all active layers of all device types fabricated by the same process.

In a preferred embodiment, the dummy features are added to all active layers where the loading effect occurs. It should be borne in mind that the above described method is carried out separately for each device which is fabricated in one production process. While the placement, size and shape of the dummy features may vary from one device to the next due to layout differences, the total area covered by active and dummy features is kept the same in order to equalize the amount of material remaining for each active layer from one device to the next. Generally, for a given layer, all devices fabricated on the same production line should be above a predetermined percentage and should be within approximately 7% of one another at most and preferably within approximately 3% of one another in terms of material remaining for that layer. It has been found that for metal 1 for several different devices, filling in all of the allowed area (i.e., regions 45 of FIG. 4) with polygons according to the earlier described considerations results in a metal remaining percentage in the range of approximately 50-55% for all devices. In some cases, however, it may be necessary or desirable as an additional parameter to specify that dummy features be added to a layer until a certain specified percentage of the substrate is covered with active plus dummy features, in order to ensure that all devices are within a range sufficient to allow the same etch and deposition recipes to be used for that layer for all devices. Of course, the dummy features do not need to be added to all active layers. If desired, they can only be added to the one or two layers where the loading effect is the most problematic.

Figure 5:
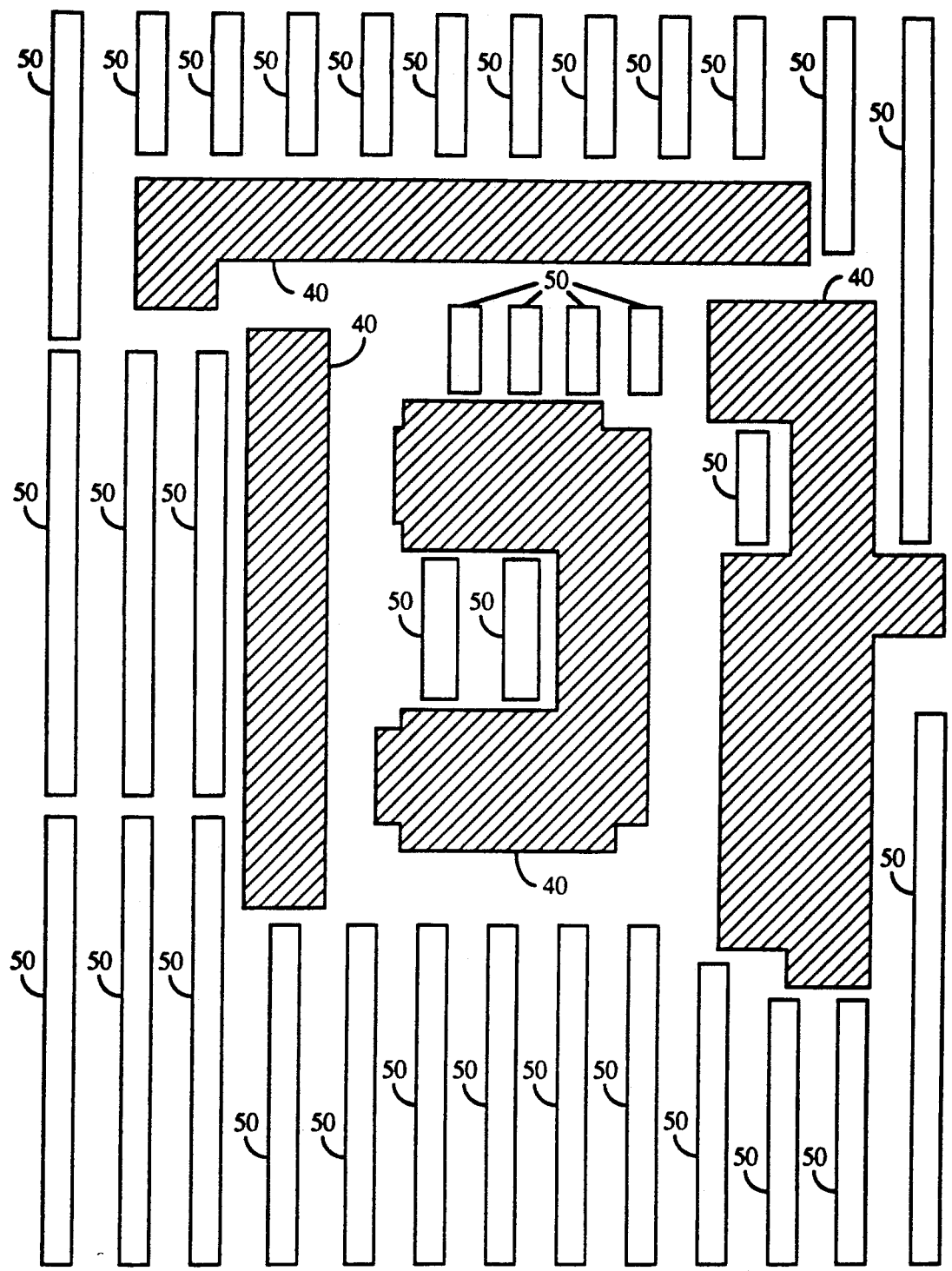
FIG. 5 shows an example of the dummy features added.

FIG. 5 shows the dummy features 50 which will be added to, for example, the metal 1 layer layout in the region depicted in FIGS. 2-4. Other regions outside of blocked regions 40 on other portions of the device not shown in FIG. 5 will contain similar dummy features 50. The dummy features 50 in the embodiment shown in FIG. 5 are similar in shape and dimension to other metal lines (with cuts or breaks to prevent the antenna effect). However, it will be appreciated that the dummy features 50 do not need to resemble metal lines and do not need to be the same general shape as one another. The dummy features 50 can be of any size and shape as described earlier.

The present invention has still other benefits in addition to allowing the use of the same recipes for etches and depositions for all devices. Since the amount of material remaining after etch is increased, etch times are reduced, increasing throughput. Also, since etch time is reduced, resist punch-through is prevented, thereby increasing reliability without a sacrifice in wafer yield. Since the dummy features are added over most of the surface of the device, the density of features, both active and dummy, is more uniform over the surface of a wafer during processing. This helps reduce a local or micro loading effect from occurring where, for example, one region etches more rapidly than another due to the differing amounts of material to be removed. Therefore, a benefit of the present invention is more uniform etches and depositions across the surface of the wafer. As a further benefit, a device fabricated by the method of the present invention is more difficult to reverse engineer than a prior art device. Since each layer contains a large number of dummy features, it is difficult for a competitor to peel apart the device and view the layout of active features in each layer.

Although the invention has been described in reference to a specific embodiment thereof, it will be evident that modifications can be made within the spirit and scope of the disclosed embodiment. For example, all layers of a device do not need to utilize the same virtual layer as has been described herein. Each layer can use its own virtual layer to define regions where dummy features can and cannot be added. In this case, a design rule guard band could be added only for the layer under consideration, rather than for each active layer. As an alternative to the sequence of steps shown in FIG. 1, the parasitic capacitance guard band could be added after all active layers have been added together (i.e., after step 14 and before step 15, for example). In general, any method which causes each of the desired active layers of all devices fabricated in a protection line to have the same percentage of the substrate covered with active plus dummy features, and which does not violate any design rules or cause unacceptable parasitic capacitance or diffusion punch-through, is within the scope of the present invention.

Thus, a method for designing and fabricating devices which will allow for processing different types of devices in a manufacturing process using the same each and deposition recipes has been described. The use of the same recipe from device to device allows for improved yield and reliability, as well as decreased throughput time. The invented method also improves etch and deposition uniformity, and makes reverse engineering of a device more difficult.

We claim:

1. A method of producing a device layer layout for a semiconductor device having a plurality of active layers, each of said active layers having a plurality of features, comprising the steps of:
   forming a layout of a first active layer, said first active layer being one of said plurality of active layers of said semiconductor device;
   defining a plurality of active regions of said first active layer, each of said active regions comprising at least one of said features of said first active layer of said semiconductor device;
   defining a plurality of blocked regions comprising said active regions;
   defining a plurality of dummy features in regions other than said blocked regions; and,
   producing said device layer layout by adding said dummy features to a layout of one of said plurality of active layers.

2. The method as described in claim 1 further comprising the steps of:
   providing at least one additional layout of an additional active layer, said additional active layer being one of said plurality of active layers;
   defining a plurality of additional active regions of said additional active layer, each of said additional active regions comprising at least one of said features of said additional active layer; and,
   defining said blocked regions by adding said active regions and said additional active regions.

3. The method as described in claim 2 wherein said at least one additional layout of said additional active layer comprises layouts of all of said plurality of active layers of said device.

4. The method as described in claim 2 wherein each of said active regions and each of said additional active regions comprise a parasitic capacitance guard band surrounding each of said features of said active layer and said at least one additional active layer, each of said parasitic capacitance guard bands having a width sufficient to prevent excess parasitic capacitance.

5. The method as described in claim 3 wherein said blocked regions further comprise user defined regions where no dummy features are to be placed.

6. The method as described in claim 4 wherein said blocked regions further comprise user defined regions where no dummy features are to be placed.

7. The method as described in claim 3 wherein said active regions and said additional active regions further comprise a design rule guard band, said design rule guard band defined in accordance with one or more design rules.

8. The method as described in claim 4 wherein said active regions and said additional active regions further comprise a design rule guard band, said design rule guard band defined in accordance with one or more design rules.

9. The method as described in claim 6 wherein said active regions and said additional active regions further comprise a design rule guard band, said design rule guard band defined in accordance with one or more design rules.

10. The method as described in claim 3 wherein said device is one of a plurality of different devices to be fabricated by a manufacturing process, and wherein said method is performed on said plurality of different devices.

11. The method as described in claim 4 wherein said device is one of a plurality of different devices to be fabricated by a manufacturing process, and wherein said method is performed on said plurality of different devices.

12. The method as described in claim 9 wherein said device is one of a plurality of different devices to be fabricated by a manufacturing process, and wherein said method is performed on said plurality of different devices.

13. The method as described in claim 10 wherein the total combined percentage of area covered by said dummy features and said features is within 7% for said device layer layout of all of said plurality of devices.

14. The method as described in claim 11 wherein the total combined percentage of area covered by said dummy features and said features is within 7% for said device layer layout of all of said plurality of devices.

15. The method as described in claim 12 wherein the total combined percentage of area covered by said dummy features and said features is within 7% for said device layer layout of all of said plurality of devices.

16. A method of fabricating a semiconductor device, said semiconductor device having a plurality of active layers, each of said active layers having a plurality of features, comprising the steps of:
   depositing a first layer of said semiconductor device on a substrate;
   forming a patterning layer on said first layer, said patterning layer comprising a plurality of active features of said semiconductor device and a plurality of dummy features, said dummy features formed in regions other than a plurality of blocked regions, wherein said blocked regions are defined by the steps of:

providing a layout of a first active layer, said first active layer being one of said plurality of active layers of said semiconductor device;

defining a plurality of active regions of said first active layer, each of said active regions comprising at least one of said features of said first active layer of said semiconductor device;

providing at least one additional layout of an additional active layer, said additional active layer being one of said plurality of active layers;

defining a plurality of additional active regions of said additional active layer, each of said additional active regions comprising at least one of said features of said additional active layer of said semiconductor device; and, defining said blocked regions by adding said active region and said additional active regions.

17. The method as described in claim 16 wherein said at least one additional layout of said additional active layer comprises layouts of all of said plurality of active layers of said device.

18. The method as described in claim 16 wherein each of said active regions and each of said additional active regions comprise a parasitic capacitance guard band surrounding each of said features of said active layer and said at least one additional active layer, each of said parasitic capacitance guard bands having a width sufficient to prevent excess parasitic capacitance.

19. The method as described in claim 17 wherein said blocked regions further comprise user defined regions where no dummy features are to be placed.

20. The method as described in claim 18 wherein said blocked regions further comprise user defined regions where no dummy features are to be placed.

21. The method as described in claim 17 wherein said active regions and said additional active regions further comprise a design rule guard band, said design rule guard band defined in accordance with one or more design rules.

22. The method as described in claim 18 wherein said active regions and said additional active regions further comprise a design rule guard band, said design rule guard band defined in accordance with one or more design rules.

23. The method as described in claim 19 wherein said active regions and said additional active regions further comprise a design rule guard band, said design rule guard band defined in accordance with one or more design rules.

24. The method as described in claim 17 wherein said device is one of a plurality of different devices to be fabricated by said method, and wherein said method is performed on said plurality of different devices.

25. The method as described in claim 18 wherein said device is one of a plurality of different devices to be fabricated by said method, and wherein said method is performed on said plurality of different devices.

26. The method as described in claim 19 wherein said device is one of a plurality of different devices to be fabricated by said method, and wherein said method is performed on said plurality of different devices.

27. The method as described in claim 24 wherein said method further comprises an etch of said first layer, and wherein the total combined percentage of area covered by said first layer remaining after said etch is within 7% for said first layer of all of said plurality of devices.

28. The method as described in claim 25 wherein said method further comprises an etch of said first layer, and wherein the total combined percentage of area covered by said first layer remaining after said etch is within 7% for said first layer of all of said plurality of devices.

29. The method as described in claim 26 wherein said method further comprises an etch of said first layer, and wherein the total combined percentage of area covered by said first layer remaining after said etch is within 7% for said first layer of all of said plurality of devices.

* * * * *